US010113228B2

United States Patent
Cheng et al.

(10) Patent No.: US 10,113,228 B2
(45) Date of Patent: Oct. 30, 2018

(54) METHOD FOR CONTROLLING SEMICONDUCTOR DEPOSITION OPERATION

(71) Applicant: TAIWAN SEMICONDUCTOR MANUFACTURING COMPANY LTD., Hsinchu (TW)

(72) Inventors: Chung-Liang Cheng, Changhua County (TW); Sheng-Wei Yeh, Taichung (TW); Chia-Hsi Wang, Changhua County (TW); Wei-Jen Chen, Taichung (TW); Yen-Yu Chen, Taichung (TW); Chang-Sheng Lee, Shin-Chu (TW); Wei Zhang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 298 days.

(21) Appl. No.: 14/311,074

(22) Filed: Jun. 20, 2014

(65) Prior Publication Data
US 2015/0371847 A1 Dec. 24, 2015

(51) Int. Cl.
*C23C 14/34* (2006.01)
*C23C 14/06* (2006.01)
*C23C 14/00* (2006.01)
*C23C 14/54* (2006.01)
*H01L 21/285* (2006.01)

(52) U.S. Cl.
CPC .......... *C23C 14/34* (2013.01); *C23C 14/0042* (2013.01); *C23C 14/0641* (2013.01); *C23C 14/54* (2013.01); *H01L 21/2855* (2013.01)

(58) Field of Classification Search
CPC ...................................... C23C 14/54
See application file for complete search history.

(56) References Cited

U.S. PATENT DOCUMENTS

| | | | | |
|---|---|---|---|---|
| 4,500,408 | A * | 2/1985 | Boys ................. | C23C 14/54 204/192.12 |
| 5,489,367 | A * | 2/1996 | Kubota ............. | C04B 35/58014 204/192.15 |
| 7,324,865 | B1 * | 1/2008 | Sonderman ............. | C23C 14/34 438/5 |
| 2006/0196765 | A1 * | 9/2006 | Cheng ................ | C23C 14/0641 204/192.1 |

* cited by examiner

*Primary Examiner* — Jason Berman
(74) *Attorney, Agent, or Firm* — WPAT, P.C., Intellectual Property Attorneys; Anthony King

(57) ABSTRACT

The present disclosure provides a method for controlling a semiconductor deposition operation. The method includes (i) identifying a first target lifetime in a physical vapor deposition (PVD) system; (ii) inputting the first target lifetime into a processor; (iii) outputting, by the processor, a plurality of first operation parameters according to a plurality of compensation curves; and (iv) performing the first operation parameters in the PVD system. The first operation parameters includes, but not limited to, an RF power tuning, a DC voltage tuning, a target to chamber pedestal spacing tuning, an AC bias tuning, an impedance tuning, a reactive gas flow tuning, an inert gas flow tuning, a chamber pedestal temperature tuning, or a combination thereof.

19 Claims, 6 Drawing Sheets

METHOD FOR CONTROLLING SEMICONDUCTOR DEPOSITION OPERATION

BACKGROUND

Physical vapor deposition (PVD) is a well-known process for depositing a thin film of material on a substrate and is commonly used in the fabrication of semiconductor devices. The PVD process is carried out at high vacuum in a chamber containing a substrate (e.g., wafer) and a solid source or slab of the material to be deposited on the substrate, i.e., a PVD target. In the PVD process, the PVD target is physically converted from a solid into a vapor. The vapor of the target material is transported from the PVD target to the substrate where it is condensed on the substrate as a thin film.

There are many methods for accomplishing PVD including evaporation, e-beam evaporation, plasma spray deposition, and sputtering. Presently, sputtering is the most frequently used method for accomplishing PVD. During sputtering, gas plasma is created in the chamber and directed to the PVD target. The plasma physically dislodges or erodes (sputters) atoms or molecules from the reaction surface of the PVD target into a vapor of the target material, as a result of collision with high-energy particles (ions) of the plasma. The vapor of sputtered atoms or molecules of the target material is transported to the substrate through a region of reduced pressure and condenses on the substrate, forming the thin film of the target material.

PVD targets have finite service lifetimes. PVD target overuse, i.e., use beyond the PVD target's service lifetime, raises reliability and safety concerns. For example, PVD target overuse can result in perforation of the PVD target and system arcing. This, in turn, may result in significant production losses, PVD system or tool damage and safety problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
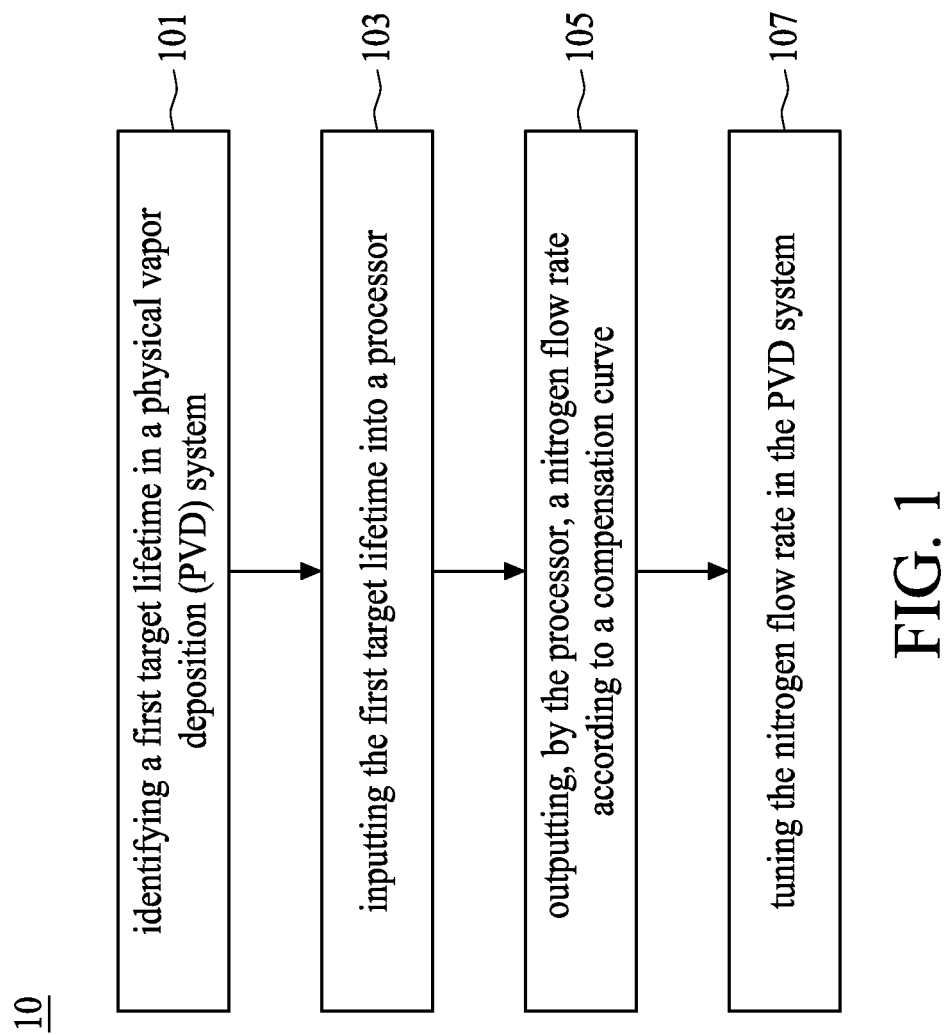
FIG. 1 shows exemplary operations of a method for controlling semiconductor deposition, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A PVD target approaching its service lifetime can be determined by several objective analyses such as the film quality. For example, the film deposited from a PVD target at a later period of its service lifetime can generate low sputter yield and low ionization rate. If all the operation parameters such as the RF and/or DC power, or the reactive gas flow in a reactive PVD system is kept constant throughout the lifetime of the target, along with the physical consumption of the target (for example, the thickness of the target may decrease), the electrical potential maintained at the PVD target decreases. The decrease of potential difference between the target end and the substrate end leads to attenuated force exerted on the inert gas particles such that the energy and density of secondary electrons and sputtered target particles, generated by inert gas particle bombarding the PVD target, decrease. The sputtered target particles are more difficult to be ionized due to the fact that the kinetic energy and density of the secondary electron is lower than those generated at the earlier period of the target service lifetime. The less the ionized target particles, the less directionality of the physical vapor deposition operation, as a result, the profile step coverage may be compromised. For example, in a low directionality PVD operation over a trench profile having a vertical sidewall, an overhang film can be generated due to lack of directional guidance to the target particles. An overhang layer can further narrow the deposition window of the subsequent deposition operations.

On the other hand, energy of the secondary electron may not only be attenuated by ineffective bombardment, but also the energy transfer from the secondary electrons to the reactive gas molecules. For example, the in a reactive sputtering operation for depositing a TiN thin film, the reactive gas (e.g. nitrogen molecules) randomly collides with the secondary electron and the energy transferred from the secondary electron to the reactive gas. Thus, the shortage of the secondary electron become more severe as far as ionizing the target particle (e.g. titanium atoms) is concerned. As such, the TiN film deposited may be a nitrogen-rich film and several film characteristics can be altered. For example, in a metal gate structure with a 28 nm gate length and under, a TiN film can be deposited as an N-stressor layer in order to enhance the carrier mobility in a NMOS channel. A nitrogen-rich film provides less compressive stress required to achieve such purpose, and hence a desired Ti to N ratio is preferred to be kept during the service lifetime of a titanium target, otherwise a device performance shift, such as a saturation current shift, can be observed.

The service lifetime of a PVD target is presently determined by tracking the accumulated energy, e.g., the number of kilowatt-hours (kw-hrs), consumed by the PVD system or processing tool. The accumulated energy method, however, takes time to master and the accuracy of this method depends solely on the hands-on experience of the technician. Moreover, a PVD target can be replaced prematurely because the film quality cannot meet the specification at a later phase of the service lifetime. In some embodiments of the present disclosure, a method for controlling a semiconductor deposition operation is presented to prolong the service lifetime of a PVD target and produce more qualified thin films within the service lifetime at a lower expense.

Referring to FIG. 1, FIG. 1 shows exemplary operations of a method 10 for controlling semiconductor deposition, according to some embodiments of the present disclosure. In operation 101, a first target lifetime is identified, for example, by a controller of a reactive physical vapor deposition (PVD) system. The "target lifetime" described herein refers to a tracking result of the accumulated energy, e.g., the number of kilowatt-hours (kw-hrs), consumed by the reactive PVD system or processing tool. Subsequently, in operation 103, the target lifetime identified by the controller of the reactive PVD system is inputted into a processor for further operation. In operation 105, a compensation curve or a segment of the compensation curve, stored in a memory device of the controller, is selected according to the inputted target lifetime, and a first operation parameter is outputted by the processor as a result of substituting the inputted target lifetime into the variable(s) of such selected segment of the compensation curve. In operation 107, the outputted first operation parameter is being executed by the reactive PVD system.

In some embodiments, a particular segment in each compensation curves is selected according to the first target lifetime. In other words, if the first target lifetime is determined to be within a predetermined range, a corresponding segment of a compensation curve is selected, generating an output (a value of an operation parameter) to be performed by the PVD system. Each compensation curve dictates at least one operation parameter, and in some embodiments, the behavior in different segment of the compensation curve varies, that is, the compensation curve can be either discontinuous or piecewise continuous. Details of the compensation curves will be discussed in FIG. 2.

Figure 4:
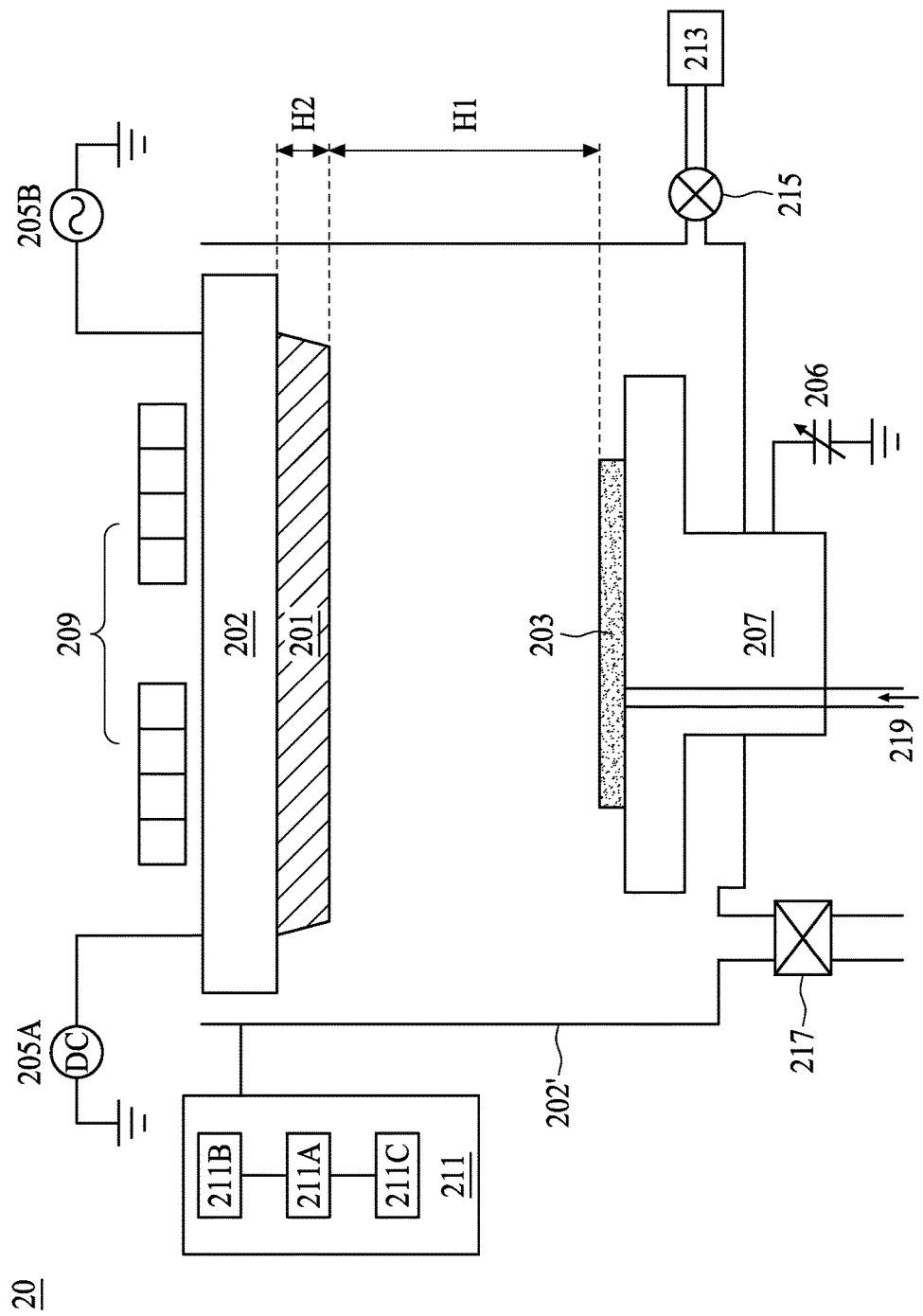
FIG. 4 is a DC/RF physical vapor deposition (PVD) system for performing the method for controlling semiconductor deposition, in accordance with some embodiments of the present disclosure.

Referring to FIG. 4, a DC/RF reactive sputtering PVD system 20 for performing a method for controlling semiconductor deposition is shown. A substrate 203 positioned on a pedestal 207 is to be deposited with target 201 materials. An RF power source 205B may be connected and applied at a very high frequency (VHF) for forming the plasma from the plasma-forming gas and ionizing atoms or particles sputtered from the target 201 by the plasma. The plasma-forming gas may include one or more inert gases, such as a noble gas, or other inert gases. For example, non-limiting examples of suitable plasma-forming gases may include argon (Ar), helium (He), xenon (Xe), neon (Ne), hydrogen ($H_2$), nitrogen ($N_2$), or the like. As used herein, a VHF frequency is a frequency in the range of from about 27 MHz to about 100 MHz. In some embodiments, the VHF frequency applied is about 60 MHz. For example, increasing the VHF frequency may increase the plasma density and/or the amount of ionization in metal atoms or particles sputtered from the target 201. The RF power source 205B connected to the target 201 may be sufficient to sputter target material. However, optionally, DC power source 205A may also be applied to the target 201 to increase the rate at which material can be sputtered from the target. In some embodiments, DC power source 205A may be applied to the target 201 to direct the plasma towards the target 201. In some embodiments, the DC power may range from about 1 to about 2 kilowatts (kW). In some embodiments, the DC power may be about 1-5 kW, or approximately 2 kW. The DC power may be adjusted to control the deposition rate of sputtered metal atoms or particles on the substrate 203. For example, increasing the DC power can result in increased interaction of the plasma with the target 201 and increased sputtering of metal atoms from the target 201.

Still referring to FIG. 4, the target 201 is at least partially disposed on a lid 202 that is generally opposite to a magnet assembly 209. The target 201 may be at least partially composed of, but is not limited to, single elements, borides, carbides, fluorides, oxides, silicides, selenides, sulfides, tellerudes, precious metals, alloys, intermetallics, or the like. For example, the target 201 may be composed of copper (Cu), silicon (Si), titanium (Ti), tantalum (Ta), tungsten (W), aluminum (Al), titanium nitride (TiN), aluminum nitride (AlN), aluminum oxide ($Al_2O_3$), silicon oxide ($SiO_2$), or silicon nitride (SiN), boron Nitride (BN), titanium oxide ($TiO_2$), tantalum oxide ($TaO_x$), hafnium oxide ($HfO_2$), or any combination thereof.

A pedestal 207 may be disposed in the chamber 202' and configured to support a substrate 203 or a wafer. In some embodiments, the pedestal 207 may be or include a chuck configured to hold the substrate 203. For example, the pedestal 207 may include a mechanical chuck, a vacuum chuck, an electrostatic chuck ("e-chuck"), or any combination thereof, for holding the substrate 203 to the pedestal 207. Mechanical chucks may include one or more clamps to secure the substrate 203 to the pedestal 207. Vacuum chucks may include a vacuum aperture (not shown) coupled to a vacuum source (not shown) to hold the substrate 203 to the pedestal 207. E-chucks rely on the electrostatic force generated by an electrode energized by a DC voltage source (not shown in FIG. 4) to secure the substrate 203 to the chuck. In some embodiments, the pedestal 207 may be or include an e-chuck powered by a DC power supply (not shown in FIG. 4). Note a temperature controlling device 219 is connected to the pedestal 207 for adjusting the pedestal temperature, and therefore the substrate temperature. In some embodiments, the pedestal 207 may be vertically movable through a bellows to allow the substrate 203 to be transferred onto another pedestal through a load lock valve (not shown) in the lower portion of PVD chamber 202' and thereafter raised to a deposition, or processing position.

In some embodiments, each of the RF power source, 205B, the DC power source 205A, and the pedestal 207 is connected to its tuning circuits (not shown). The tuning circuits may have several different configurations, for example, the tuning circuits may be a fixed circuit, a manually tunable circuit, a circuit controlled by a system controller 211, an auto-tuning circuit, or any combination thereof. With a fixed circuit, the tuning circuits may include fixed, i.e. non-adjustable, circuit elements. With a manually tunable circuit, the tuning circuits may include adjustable or variable circuit elements (e.g. variable reactive elements). For example, as shown in FIG. 4, a manually tunable circuit (one or more variable capacitors 206) is connected to the pedestal 207. The variable capacitors 206 may be manually adjusted with a screw or knob. If the tuning circuits are controlled by the system controller 211, circuit elements of the tuning circuits may be adjusted with stepper motors (not shown) based on control signals from the system controller 211. As shown in the PVD system 20, one or more processing gases may be supplied from a gas source 213 through a mass flow controller 215 into the lower part of the PVD chamber 202'. An exhaust port 217 may be provided and coupled to a pump (not shown) via a valve for exhausting the interior of the PVD chamber 202' and maintaining a desired pressure inside the PVD chamber 202'.

Still referring to FIG. 4, a system controller 211 may be provided and coupled to various components of the PVD chamber 202' to control the operation thereof. The system controller 211 includes a central processor 211A, a memory 211B, and support circuits 211C. The system controller 211 may control the PVD chamber 202' directly, or via computers associated with particular PVD chamber and/or support system components. The system controller 211 may be one of any form of general-purpose computer processor that can be used in an industrial setting for controlling various chambers and sub-processors. The memory 211B, or computer readable medium, of the system controller 211 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 211C are coupled to the processor 211A for supporting the processor in a conventional manner. These circuits include cache, power supplies, clock circuits, input/output circuitry and subsystems, and the like. Methods for controlling semiconductor deposition as described herein may be stored in the memory 211B as software routine that may be executed or invoked to control the operation of the PVD chamber 202' in the manner described herein. The software routine may also be stored and/or executed by a second processor and a second memory (not shown) that are remotely located from the hardware being controlled by the processor 211A.

Figure 2:
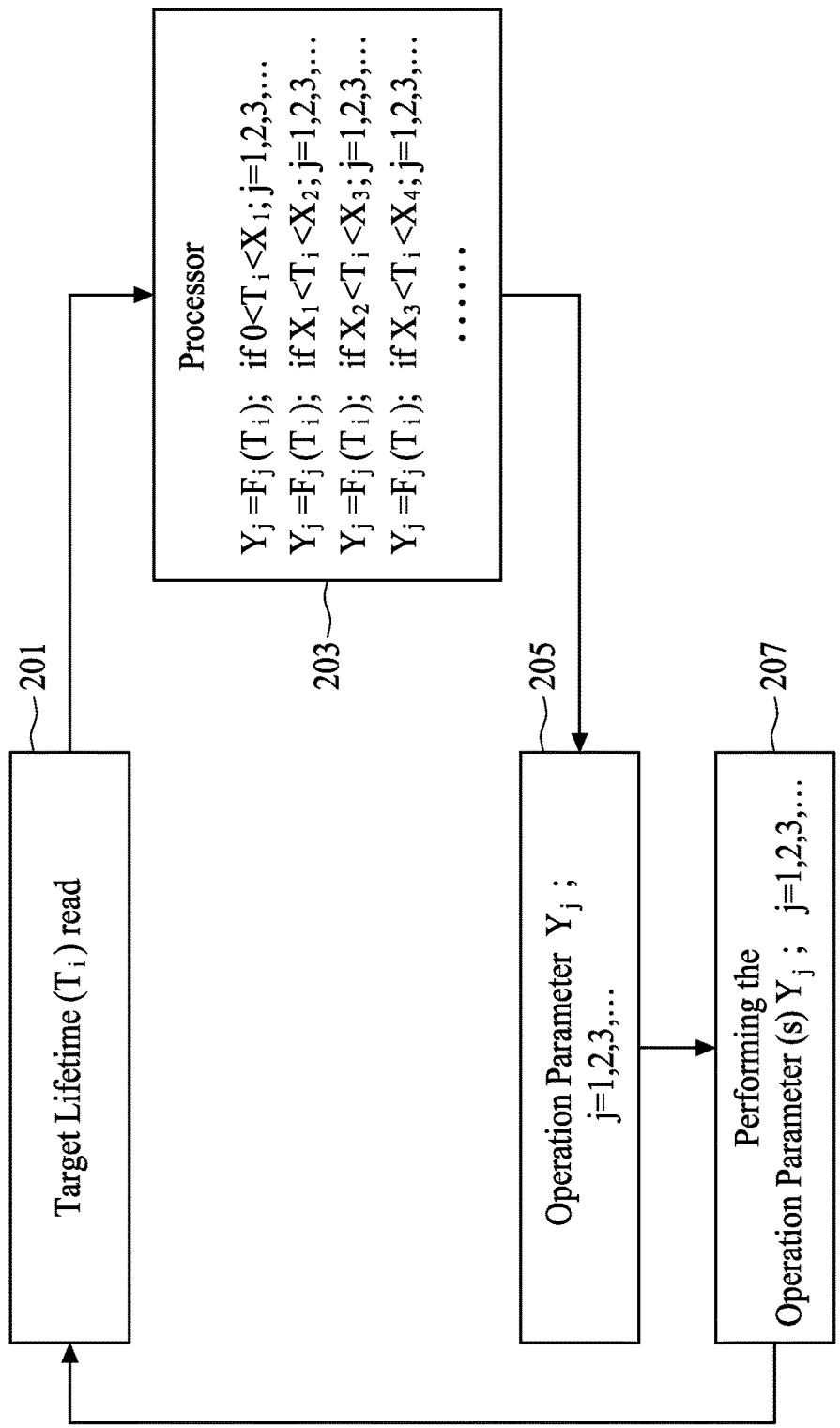
FIG. 2 is a block diagram of a processing sequence in a method for controlling semiconductor deposition, in accordance with some embodiments of the present disclosure.

Referring to FIG. 2 and FIG. 4, FIG. 2 is a block diagram of a processing sequence in a method for controlling semiconductor deposition operation, in accordance with some embodiments of the present disclosure. In block 201, a first target lifetime $T_i$ is read by the system controller 211, temporarily stored in the memory 211B and subsequently inputted to the processor 211A as illustrated in block 203. In some embodiments, the inputted first target lifetime $T_i$ is first determined to be in a predetermined time range, for example, in a range between T=0 and $T=X_1$, and then being substituted into a corresponding segment of a compensation function $F_j$. An operation parameter $Y_j$ can be a processing result after substituting the first target lifetime $T_i$ into the compensation function $F_j$. As shown in block 203, the subscript j of the operation parameter and the compensation function refer to a specific category of PVD operation parameter. For example, the operation parameters can include an RF power tuning, a DC voltage tuning, a target to chamber pedestal spacing tuning, an AC bias tuning, an impedance tuning, a reactive gas flow tuning, an inert gas flow tuning, a chamber pedestal temperature tuning when j=1, 2, 3, 4, 5, 6, 7, 8, respectively.

In block 205, one or several operation parameters $Y_j$ is (are) outputted from the processor 211A and sending to various elements of the PVD system 20 through supporting circuits 211C. While the determined operation parameters $Y_j$ is being executed as shown in block 207, a calculator optionally devised in the system controller 211 replaces the first target lifetime $T_i$ to a second target lifetime $T_{i+1}$. The method provided in the present disclosure returns to block 201 for reading a second target lifetime $T_{i+1}$ and conducting the operations previously described in blocks 204, 205, and 207. In some embodiments, a difference between the first target lifetime and the second target lifetime may be from about one fourth to about one third of the entire target service lifetime. That is, among the entire target service lifetime, three to four lifetime reading is conducted in order to adjust the operation parameters for the PVD system. The entire "target service lifetime" described herein is a calibration result of the service lifetime of a PVD target operated under the method provided herein. For example, if a target service lifetime for a TiN film deposition is around 2800 kw-hrs, the first target lifetime may be read in a range of from about 700 kw-hrs to about 930 kw-hrs. However, the quantity of reading the target lifetime in order to adjust the PVD operation conditions accordingly is not limited to three or four. A greater number can also be adopted as long as the compensation curve may offer meaningful operation parameter changes.

Figure 5:
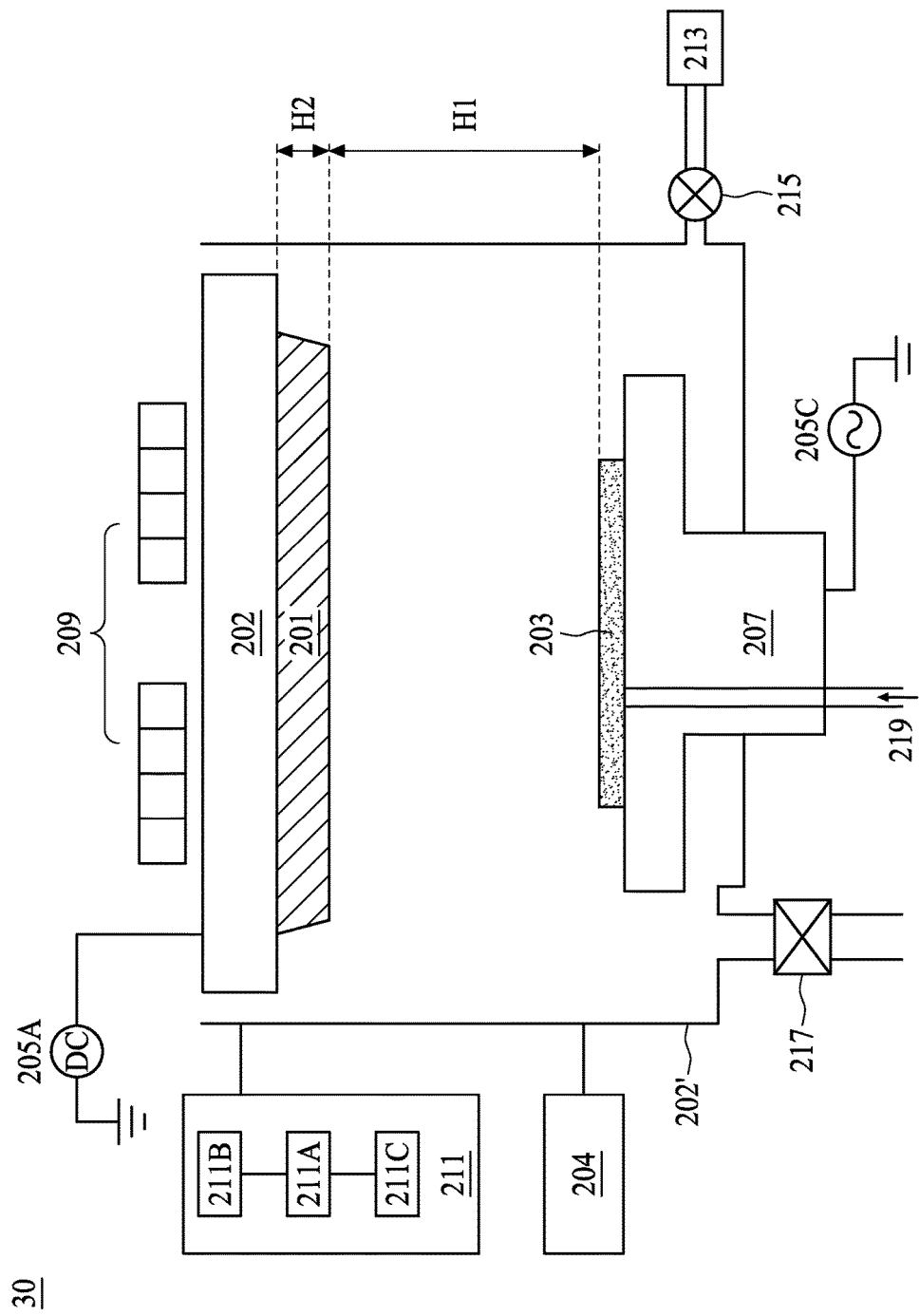
FIG. 5 is a DC-only physical vapor deposition (PVD) system for performing the method for controlling semiconductor deposition, in accordance with some embodiments of the present disclosure.

Referring to FIG. 5, FIG. 5 is a DC-only reactive sputtering PVD system 30 for performing the method for controlling semiconductor deposition, in accordance with some embodiments of the present disclosure. Elements with identical numeral labels are referred to the identical items or their equivalents as shown in FIG. 4, and are not repeated here for simplicity. In FIG. 5, a DC power source 205A is connected to the lid 202 and a metal target 201. On the opposite side of the lid 202 positioned a pedestal 207 supporting the substrate 203. In the PVD system 30, an RF bias power source 205C may be coupled to the pedestal 207 in order to induce a negative DC bias on the substrate 203. In addition, in some embodiments, a negative DC self-bias may form on the substrate 203 during processing. For example, an RF power supplied by the RF bias power source 205C may range in frequency from about 2 MHz to about 60 MHz, for example, non-limiting frequencies such as 2 MHz, 13.56 MHz, or 60 MHz can be used. Further, a second RF bias power source (not shown) may be coupled to the pedestal 207 and provide any of the frequencies discussed above for use with the RF bias power source 205C. In other applications, the pedestal 207 may be grounded or left electrically floating. In some embodiments, the PVD system 30 of FIG. 5 further includes a communication interface 204, for example, a monitor, showing the operation parameters required at the instant deposition operation, according to the method provided herein.

In some embodiments, the operation parameters determined as a result of calculating the compensation curve are shown on the communication interface 204, notifying the operator of the PVD system to manually change the calibration point for such operation parameters. For example, if a temperature of the pedestal 207 is controlled at around 400 degrees Celsius at the initial target lifetime while depositing an aluminum film, a calculated operation parameter shows a 10 degrees increase is required after the aluminum target has conducted 1800 kW-hr of service, the calibration point of the temperature controlling device may be offset by 10 degrees in an opposite direction in order to gain a 10 degrees temperature increase at the pedestal 207. Alternatively, the calculated parameters can be executed through auto command sending out from the system controller 211 to specific portions of the PVD system, such as a mass flow controller 215, a temperature controlling device 219, a DC power source 205A, an RF power source 205B, or a bellows of the pedestal 207, without changing the calibration point of such operation parameters. Optionally, the communication interface 204 can be omitted in PVD system 30.

Figure 3:
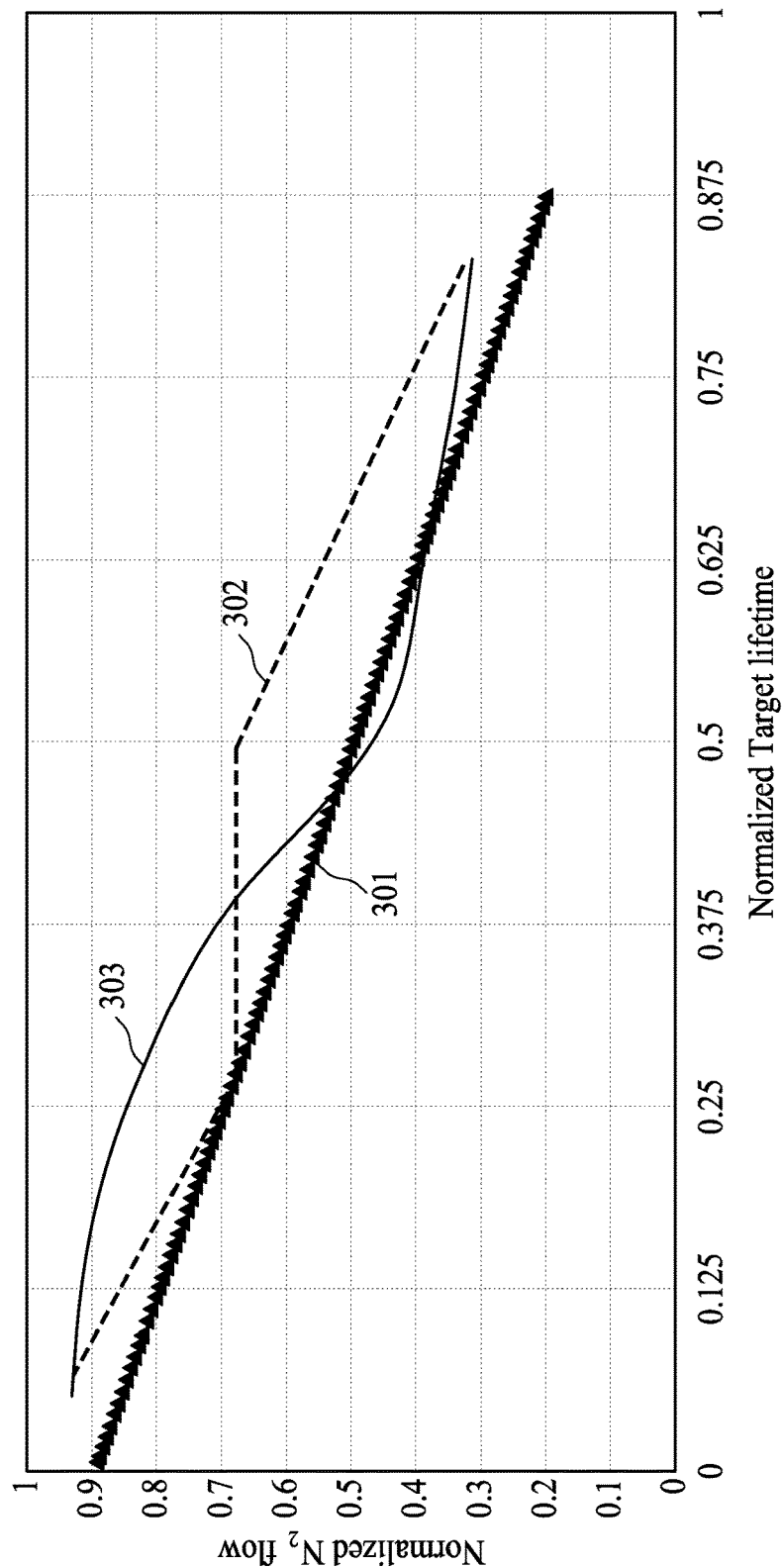
FIG. 3 is a compensation curve showing a nitrogen flow rate as a function of target lifetime, in accordance with some embodiments of the present disclosure.

Referring to FIG. 2 and FIG. 3, FIG. 3 is a compensation curve showing a nitrogen flow rate as a function of target lifetime, in accordance with some embodiments of the present disclosure. FIG. 3 is a schematic representation of the compensation curve $F_j$ described in block 203 of FIG. 2. Note that the horizontal axis and the vertical axis in FIG. 3 are plotted in a normalized manner. The compensation curves shown in FIG. 3 represent the relation between the operation parameters $Y_j$ (i.e. the nitrogen flow rate) and the target lifetime $T_i$. The relation between the two can be linear (as in curve 301), step-wise (as in curve 302), polynomial (as in curve 303), or a combination thereof. In some embodiments, a discontinuous curve (not shown), that is, a sudden jump or a sudden plunge of an operation parameter, can be used to describe the compensation relation between the operation parameter and the target lifetime. Note in FIG. 3, a trend of the nitrogen gas flow decreases as the target lifetime increases, however, other operation parameters may have different trends at least in a period of the target lifetime. In other embodiments, the trend of a particular operation parameter is determined considering the variations of other operation parameters.

In some embodiments, a method for controlling a PVD deposition of a TiN layer is provided. Referring to FIGS. 1, 2, 4, and 5, a metal target (e.g. a Ti target) lifetime is identified by the system controller 211 of a PVD system (20 or 30). For example, the metal target lifetime can be read at any time point during the service lifetime of the metal target. The metal target lifetime is then inputted to the processor 211A. Following block 203 of FIG. 2, the inputted target lifetime is categorized into a predetermined time period, for example, a time period between $X_1$ and $X_2$, then a portion of a compensation curve $F_j$ corresponding to such time period ($X_1 < T_i < X_2$) generates an operation parameter as a result of substituting the target lifetime $T_i$ into said portion of the compensation curve. For example, the compensation curve 302 in FIG. 3 represents the nitrogen flow variation throughout the service lifetime of the metal target 201. At a normalized target lifetime of about 0.375, a normalized nitrogen flow at about 0.69 is generated and outputted from the processor 211A to the support circuit 211C, and further performed by sending the predetermined nitrogen flow to the mass flow controller 215 for direct nitrogen flow alternation. For another example, at a normalized target lifetime of about 0.625, a normalized nitrogen flow at about 0.52 is generated and outputted from the processor 211A to the support circuit 211C, and further performed by sending the predetermined nitrogen flow to the mass flow controller 215 for direct nitrogen flow alternation. On the other hand, the signal of a 0.69 and 0.52 nitrogen flow described above can be sending from the processor 211A to a communication interface 204, notifying the operator to reset a calibration point of the mass flow controller 215 as described previously.

As shown in FIG. 3, the nitrogen flow decreases as the target lifetime increases. Although the compensation curve can includes a linear function, a step function, a polynomial function, or a superposition of the functions listed above, the trend of nitrogen flow generally decreases as the target lifetime increases. However, the trend for other operation parameters may differ according to the different considerations. For example, the inert gas flow can increases as the target lifetime increases, in order to maintain a suitable chamber pressure at the decrease of the nitrogen gas inputs. For another example, the RF power provided by the RF power source 205B, the DC power provided by the DC power source 205A, and/or the AC bias 205C can be increased as the target lifetime increases, in order to maintain effective bombardment at the metal target. A target-to-pedestal spacing H1 as shown in FIG. 4 and FIG. 5 can be one of the operation parameters. The thickness H2 of the target 201 can decreases as a result of consumption of the target materials during deposition, and hence the target-to-pedestal spacing H1 changes at a later period of the target lifetime. One of the operation parameters $Y_j$ is performed to compensate such drifting spacing H1 and in some embodiments, maintaining a preferred spacing H1 range that is calibrated for best film uniformity acquired. In some embodiments, impedance can be one of the operation parameters to be tuned. As shown in FIG. 4, the capacitance of the variable capacitor 206 increases as the target lifetime increases. Since the capacitance is inversely proportional to the impedance of the PVD system 20, lower impedance (i.e. a greater capacitance) is required to increase the directionality of the sputtering operation at a later period of the target lifetime.

In some embodiments, a method for controlling a PVD deposition of a metallization operation, for example an Al layer deposition, is provided. Referring to FIGS. 1, 2, 4, and 5, a metal target (e.g. an Al target) lifetime is identified by the system controller 211 of a PVD system (20 or 30). For example, the Al target lifetime can be read at any time point during the service lifetime of the metal target. The metal target lifetime is then inputted to the processor 211A. Following block 203 of FIG. 2, the inputted target lifetime is categorized into a predetermined time period, for example, the inputted target lifetime is between $X_2$ and $X_3$, then a portion of a compensation curve $F_j$ corresponding to such time period ($X_2 < T_i < X_3$) generates an operation parameter as a result of substituting the target lifetime $T_i$ into said portion of the compensation curve. In some embodiments, the pedestal temperature, one of the operation parameters, increases as the target lifetime increases. The compensation curve for the pedestal temperature can be a linear function, a step function, a polynomial function, or a superposition thereof. As the target lifetime increases, an erosion of the pedestal 207 can be more severe and thus the temperature at the pedestal may decrease given other operation parameters kept at constant. For example, the temperature variation at pedestal 207 can be tracked by in-situ observation of the reflectivity of the deposited Al film. An increased reflectivity of the Al film indicates a drop of pedestal temperature, consequently, a compensation curve with an increasing trend of the pedestal temperature as the target lifetime increase is desired. In some embodiments, a 10 to 15 degrees Celsius offset of the pedestal temperature is required at a later period of the Al target service lifetime. In some embodiments, the flow rate of liquid helium in the temperature controlling device 219 is used to conduct the temperature tuning at the pedestal 207.

Figure 6:
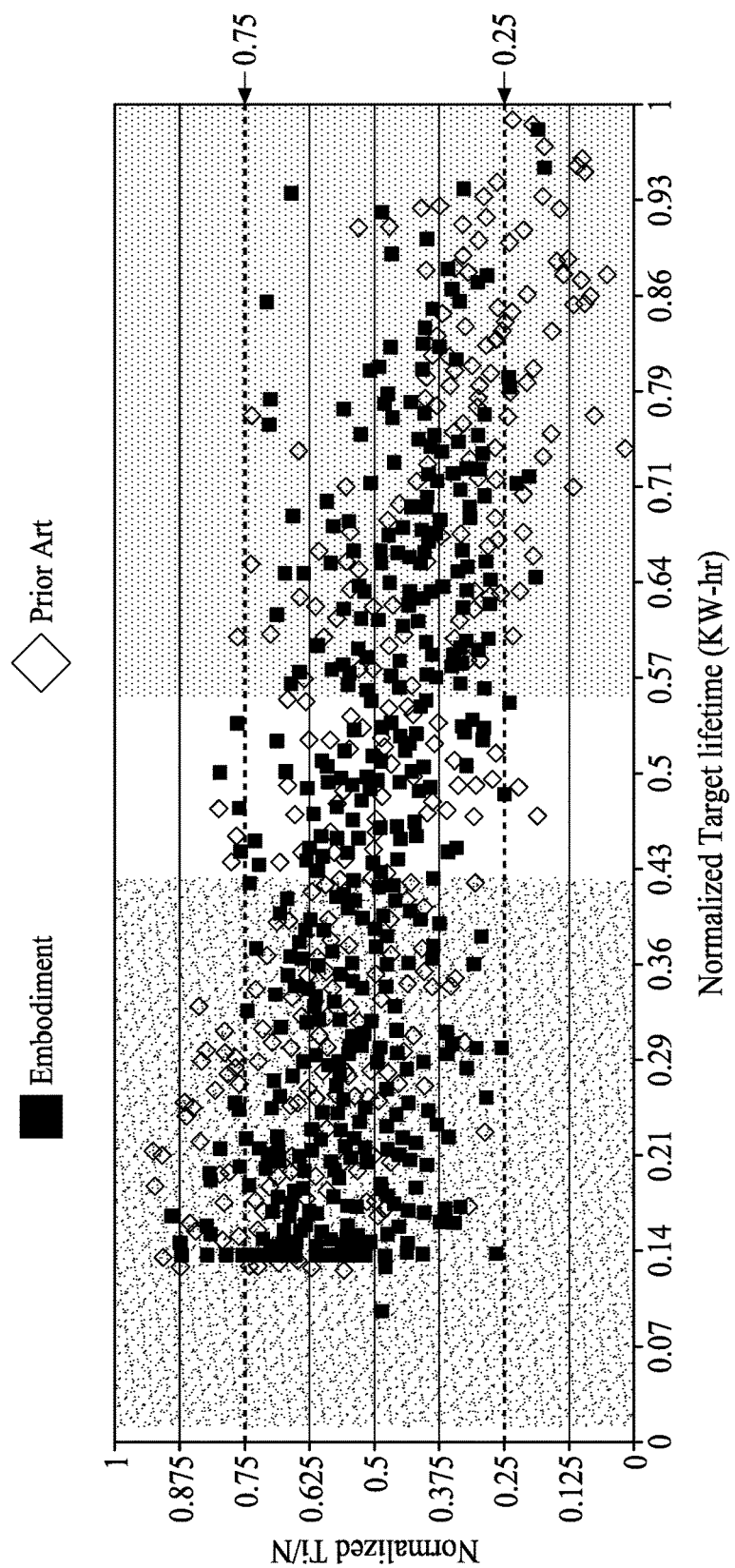
FIG. 6 is a diagram comparing a titanium to nitrogen ratio between a semiconductor layer deposited using prior art and using the method for controlling semiconductor deposition, in accordance with some embodiments of the present disclosure.

Although an Al layer is provided herein as an example of metallization operation, the method provided herein can be adapted to other metallization operations such as Ti, TiN, Ta, TaN, C, W, or Co film deposition. In some embodiments, at least three target lifetime is identified during a full service target lifetime of a target. Referring to FIG. 6, a full service target lifetime is determined by the elemental constitution of the deposited film, such as a TiN film. Note that the horizontal axis and the vertical axis in FIG. 3 are plotted in a normalized manner. A titanium to nitrogen atomic ratio is determined by X-ray photoelectron spectroscopy (XPS), and an acceptable normalized Ti/N range of from about 0.25 to about 0.75 is used to define a full service target lifetime. Alternatively stated, the TiN film deposited using methods in prior art demonstrates a normalized 0.64 full service lifetime because a substantial number of TiN film show a titanium to nitrogen atomic ratio lower than 0.25 after 0.64 of service. However, the TiN film deposited using the method presented herein (Embodiments) shows a 1 full service lifetime according to the above-mentioned standard. In some embodiments, at least three Ti target lifetime is identified before the 1 full service lifetime. The three Ti target lifetime can be sampled at 0.43, 0.64, and 0.79. However, more or less Ti target lifetime reading in the span of the full target service lifetime is enclosed in the contemplated scope of the present disclosure. Not only the operation parameters such as an RF power, a DC voltage, a target to chamber pedestal spacing, an AC bias, an impedance, a reactive gas flow, an inert gas flow, a chamber pedestal temperature can be tuned, in some embodiments, a deposition duration can also be tuned according to the corresponding compensation curve. For example, the deposition duration of a particular target can be increased as the later phase of the full target service lifetime is approached.

In some embodiments, an N-metal gate structure manufactured according to the method for controlling semiconductor deposition, in accordance with some embodiments of the present disclosure. In some embodiments, the TiN layer and the Al layer in the N-metal gate structure can be deposited using the method provided herein. The semiconductor deposition method provided herein resolves the low sputter yield problem and therefore a more uniformed Ti/N ratio is obtained. The Ti/N atomic ratio is closer to unity and an N-rich TiN film acquired using prior art methods can be prevented. A better controlled Ti/N ratio acts as a superior stressor layer in an NMOS for better device performance. However, a TiN film with Ti/N ratio close to unity and a TiN film thickness of from about 30 Å to about 40 Å allows more aluminum to penetrate through. As such, a thickness of a TaN layer is deposited to be from about 10 Å to about 15 Å to compensate the insufficient Al blocking at the TiN layer. On the other hand, the semiconductor deposition method provided herein resolves the low ionization rate problem and therefore an overhang layer is eliminated. An overhang layer deteriorates the deposition effectiveness of the subsequent layers. For example, if the TiN layer is an overhang layer because a prior art deposition method is applied, the subsequent Ti wetting layer and the Al layer may not form a conformal interface between the later-deposited layer and the TiN layer. As such, the variation of the intermixing layer TiAl$_3$ formed during a post-deposition annealing operation may be large enough to shift NMOS device performance. Therefore, an N-metal gate structure manufactured using the method provided herein can effectively reduce and above-mentioned problems.

Some embodiments of the present disclosure provide a method for controlling a semiconductor deposition operation. The method includes (i) identifying a first target lifetime in a physical vapor deposition (PVD) system; (ii) inputting the first target lifetime into a processor; (iii) outputting, by the processor, a nitrogen flow rate according to a compensation curve; and (iv) tuning the nitrogen flow rate in the PVD system.

In some embodiments of the present disclosure, the compensation curves include a linear function, a step function, a polynomial function, or a combination thereof.

In some embodiments of the present disclosure, the tuning the nitrogen flow rate in the PVD system includes altering a calibration point of one of the first operation parameters.

In some embodiments of the present disclosure, the method further includes (i) identifying a second target lifetime in a PVD system; (ii) inputting the second target lifetime into the processor; (iii) outputting a plurality of second operation parameters according to the plurality of compensation curves; and (iv) performing the second operation parameters in the PVD system.

In some embodiments of the present disclosure, a difference between the first target lifetime and the second target lifetime is in a range of from about one fourth to about one third of a target service lifetime.

In some embodiments of the present disclosure, the second operation parameters include an RF power tuning, a DC voltage tuning, a target to chamber pedestal spacing tuning, an AC bias tuning, an impedance tuning, a reactive gas flow tuning, an inert gas flow tuning, a chamber pedestal temperature tuning, or a combination thereof.

Some embodiments of the present disclosure provide a method for controlling a metal nitride layer deposition. The method includes identifying a metal target lifetime in a physical vapor deposition (PVD) system; inputting the metal target lifetime into a processor; outputting, by the processor, an operation parameter according to a compensation curve; and performing the operation parameter in the PVD system.

In some embodiments of the present disclosure, the performing the operation parameter includes altering a nitrogen gas flow to a predetermined value according to the compensation curve.

In some embodiments of the present disclosure, the nitrogen gas flow decreases or maintains at a same level as the inputted metal target lifetime increases.

In some embodiments of the present disclosure, the operation parameter further includes an RF power tuning, a DC voltage tuning, a target to chamber pedestal spacing tuning, an AC bias tuning, an impedance tuning, an inert gas flow tuning, a chamber pedestal temperature tuning, or a combination thereof.

In some embodiments of the present disclosure, the inert gas flow increases as the inputted metal target lifetime increases.

In some embodiments of the present disclosure, at least one of the RF power, the DC voltage, and the AC bias increases as the inputted metal target lifetime increases.

In some embodiments of the present disclosure, the compensation curve includes a linear function, a step function, a polynomial function, or a combination thereof.

In some embodiments of the present disclosure, the identifying the metal target lifetime in the PVD system includes identifying at least three metal target lifetime in a subsequent manner throughout a metal target service lifetime.

In some embodiments of the present disclosure, the altering the nitrogen gas flow to a predetermined value includes the processor sending a signal to a mass flow controller of the PVD system.

In some embodiments of the present disclosure, the altering the nitrogen gas flow to a predetermined value includes the processor sending a signal to a communication interface of the PVD system.

Some embodiments of the present disclosure provide a method for controlling a metallization operation. The method includes identifying a target lifetime in a physical vapor deposition (PVD) system; inputting the target lifetime into a processor; outputting, by the processor, an operation parameter according to a compensation curve; and performing the operation parameter in the PVD system.

In some embodiments of the present disclosure, the metallization operation includes performing a Ti, TiN, Ta, TaN, Al, Cu, W, Co deposition, or the combination thereof, in the PVD system.

In some embodiments of the present disclosure, the operation parameter includes an RF power tuning, a DC voltage tuning, a target to chamber pedestal spacing tuning, an AC bias tuning, an impedance tuning, a reactive gas flow tuning, an inert gas flow tuning, a chamber pedestal temperature tuning, or a combination thereof.

In some embodiments of the present disclosure, the operation parameter further includes a deposition duration tuning.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for controlling a semiconductor deposition operation, comprising:
   identify a normalized full service target lifetime according to off-line measurements;
   identifying a first target lifetime by a controller in a physical vapor deposition (PVD) system, the first target lifetime being identified at about 0.43 of the normalized full service target lifetime;
   inputting the first target lifetime into a processor;
   outputting, by the processor, a reactive gas flow rate according to a segment corresponding to the first target lifetime of a compensation curve, the compensation curve being predetermined and stored in a memory device of the controller; and
   tuning the reactive gas flow rate in the PVD system so as to achieve an atomic ratio of target material and reactive gas of a deposited layer close to unity at the first target lifetime.

2. The method of claim 1, wherein the compensation curves comprise a linear function, a step function, a polynomial function, or a combination thereof.

3. The method of claim 1, wherein the tuning the reactive gas flow rate in the PVD system comprises altering a calibration point of one of the first operation parameters.

4. The method of claim 1, further comprising:
   identifying a second target lifetime in a PVD system;
   inputting the second target lifetime into the processor;
   outputting a plurality of second operation parameters according to the plurality of compensation curves; and
   performing the second operation parameters in the PVD system.

5. The method of claim 4, wherein a difference between the first target lifetime and the second target lifetime is in a range of from about one fourth to about one third of a target service lifetime.

6. The method of claim 4, wherein the second operation parameters comprise an RF power tuning, a DC voltage tuning, a target to chamber pedestal spacing tuning, an AC bias tuning, an impedance tuning, a reactive gas flow tuning, an inert gas flow tuning, a chamber pedestal temperature tuning, or a combination thereof.

7. A method for controlling a metal nitride layer deposition, comprising:
   identify a normalized full service titanium target lifetime according to off-line measurements;
   identifying a titanium target lifetime by a controller in a physical vapor deposition (PVD) system, the titanium target lifetime being identified at about 0.64 of the normalized full service titanium target lifetime;
   inputting the titanium target lifetime into a processor;
   outputting, by the processor, a nitrogen flow rate-according to a segment corresponding to the titanium target lifetime of a compensation curve, the compensation curve being predetermined and stored in a memory device of the controller; and
   tuning the nitrogen flow rate in the PVD system so as to achieve an atomic ratio of titanium and nitrogen of the titanium nitride layer close to unity at the titanium target lifetime.

8. The method of claim 7, wherein the tuning the nitrogen flow rate comprises altering a nitrogen gas flow to a predetermined value according to the compensation curve.

9. The method of claim 8, wherein the nitrogen gas flow decreases or maintains at a same level as the inputted titanium target lifetime increases.

10. The method of claim 8, further comprising an RF power tuning, a DC voltage tuning, a target to chamber pedestal spacing tuning, an AC bias tuning, an impedance tuning, an inert gas flow tuning, a chamber pedestal temperature tuning, or a combination thereof.

11. The method of claim 7, wherein the compensation curve comprises a linear function, a step function, a polynomial function, or a combination thereof.

12. The method of claim 7, wherein the identifying the titanium target lifetime in the PVD system comprises identifying at least three titanium target lifetime in a subsequent manner throughout a titanium target service lifetime.

13. The method of claim 8, wherein the altering the nitrogen gas flow to a predetermined value comprises the processor sending a signal to a mass flow controller of the PVD system.

14. The method of claim 8, wherein the altering the nitrogen gas flow to a predetermined value comprises the processor sending a signal to a communication interface of the PVD system.

15. A method for controlling a metallization operation, comprising:
   identify a normalized full service target lifetime according to off-line measurements;
   identifying a target lifetime by a controller in a physical vapor deposition (PVD) system, the target lifetime being identified at about 0.43, 0.64, and 0.79 of the normalized full service target lifetime;
   inputting the target lifetime into a processor;
   outputting, by the processor, a reactive gas flow rate according to a segment corresponding to the target lifetime of a compensation curve, the compensation curve being predetermined and stored in a memory device of the controller, the reactive gas flow rate is determined according to the segment so as to achieve an atomic ratio of target material and reactive gas of a metallization close to unity at the target lifetime; and
tuning the reactive gas flow rate in the PVD system.

16. The method of claim 15, wherein the metallization operation comprises performing a Ti, TiN, Ta, TaN, Al, Cu, W, Co deposition, or the combination thereof, in the PVD system.

17. The method of claim 15, wherein the reactive gas flow rate comprises a nitrogen flow rate.

18. The method of claim 15, wherein the compensation curve comprises a linear function, a step function, a polynomial function, or a combination thereof.

19. The method of claim 7, wherein the tuning the nitrogen flow rate in the PVD system comprises altering a calibration point of the nitrogen flow rate.

* * * * *